United States Patent
Kim (10) Patent No.: US 9,660,128 B2
(45) Date of Patent: May 23, 2017

(54) PASTE FOR PREPARING MASK PATTERNS AND MANUFACTURING METHOD OF SOLAR CELL USING THE SAME

(75) Inventor: Min-Seo Kim, Daejeon (KR)

(73) Assignee: LG CHEM, LTD., Seoul (KR)

(*) Notice: Subject to any disclaimer, the term of this patent is extended or adjusted under 35 U.S.C. 154(b) by 508 days.

(21) Appl. No.: 13/501,686

(22) PCT Filed: Oct. 12, 2010

(86) PCT No.: PCT/KR2010/006970
§ 371 (c)(1),
(2), (4) Date: Oct. 19, 2012

(87) PCT Pub. No.: WO2011/046347
PCT Pub. Date: Apr. 21, 2011

(65) Prior Publication Data
US 2013/0034928 A1 Feb. 7, 2013

(30) Foreign Application Priority Data
Oct. 13, 2009 (KR) .................... 10-2009-0097297

(51) Int. Cl.
*H01L 31/18* (2006.01)

(52) U.S. Cl.
CPC ........ *H01L 31/1804* (2013.01); *Y02E 10/547* (2013.01); *Y02P 70/521* (2015.11)

(58) Field of Classification Search
CPC ....... H01L 31/022425; H01L 21/31144; H01L 21/32
See application file for complete search history.

(56) References Cited

U.S. PATENT DOCUMENTS

| | | | | |
|---|---|---|---|---|
| 5,156,771 | A * | 10/1992 | Yamamoto et al. | 252/512 |
| 5,209,814 | A | 5/1993 | Felten et al. | |
| 6,069,065 | A * | 5/2000 | Arimoto et al. | 438/612 |
| 7,625,420 | B1 * | 12/2009 | Kodas et al. | 75/252 |
| 2002/0016017 | A1 * | 2/2002 | Sakai et al. | 438/57 |

(Continued)

FOREIGN PATENT DOCUMENTS

| | | |
|---|---|---|
| JP | 06-053135 | 2/1994 |
| JP | 2000-089456 | 3/2000 |

(Continued)

OTHER PUBLICATIONS

Szlufcik, "Simple integral screenprinting process for selective emitter polycristalline silicon solar cells," Appl. Phys. Lett. 59 (13), Sep. 23, 1991, pp. 1583-1584.*

(Continued)

*Primary Examiner* — Hrayr A Sayadian
(74) *Attorney, Agent, or Firm* — Dentons US LLP (57) ABSTRACT

Provided are a paste for preparing etching mask patterns and a manufacturing method of a silicon solar cell using the same. The paste composition for preparing mask patterns is used to form a selective emitter of a silicon solar cell, and includes inorganic powder, an organic solvent, a binder resin, and a plasticizer. The mask patterns prepared from the paste composition have good adhesion with a substrate, thereby preventing edge curling, and have good etching resistant characteristic in an etch-back process for forming a selective emitter, enabling formation of a stable emitter.

5 Claims, 7 Drawing Sheets

(56) References Cited

U.S. PATENT DOCUMENTS

| | | |
|---|---|---|
| 2002/0016401 A1 | 2/2002 | Yamashita et al. |
| 2002/0034611 A1* | 3/2002 | Masuko et al. ............... 428/168 |
| 2002/0035183 A1 | 3/2002 | Yamashita et al. |
| 2003/0134469 A1* | 7/2003 | Horzel et al. ................. 438/249 |
| 2003/0143805 A1* | 7/2003 | Okudaira .......... H01L 21/31116 438/253 |
| 2003/0215747 A1* | 11/2003 | Kim et al. ................. 430/284.1 |
| 2004/0004209 A1* | 1/2004 | Matsuba et al. ........... 252/518.1 |
| 2004/0076813 A1* | 4/2004 | Han et al. .................. 428/312.6 |
| 2004/0149332 A1* | 8/2004 | Tanaka et al. ............... 136/256 |
| 2005/0003199 A1* | 1/2005 | Takaya et al. ............... 428/413 |
| 2006/0035071 A1* | 2/2006 | Ishiyama ............ C04B 35/4682 428/325 |
| 2007/0147767 A1* | 6/2007 | Nonaka et al. ............... 385/142 |
| 2008/0230118 A1* | 9/2008 | Nakatani et al. ............. 136/255 |
| 2008/0233416 A1* | 9/2008 | Takase ......................... 428/480 |
| 2009/0117383 A1* | 5/2009 | Isobe .................... C01G 23/00 428/402 |
| 2009/0142911 A1* | 6/2009 | Asano et al. ................. 438/542 |
| 2009/0218945 A1 | 9/2009 | Kamada et al. |
| 2009/0250103 A1* | 10/2009 | Katoh et al. ................. 136/256 |
| 2011/0135931 A1* | 6/2011 | Ishihara ....................... 428/402 |
| 2012/0040490 A1* | 2/2012 | Gallazzo et al. ............... 438/87 |

FOREIGN PATENT DOCUMENTS

| | | |
|---|---|---|
| JP | 2000-109341 | 4/2000 |
| JP | 2005-519473 | 6/2005 |
| JP | 2006-80496 | 3/2006 |
| JP | 2008-63497 | 3/2008 |
| JP | 2009-129600 A | 6/2009 |
| JP | 2009-231827 A | 10/2009 |
| KR | 10-2009-0017812 A | 2/2009 |
| KR | 10-2009-0089526 | 8/2009 |
| KR | 10-2009-0089526 A | 8/2009 |
| KR | 10-2009-0090843 A | 8/2009 |
| WO | 03/075351 | 9/2003 |
| WO | 2007/099793 | 9/2007 |
| WO | 2009/013307 | 1/2009 |

OTHER PUBLICATIONS

"Plasticizer and its application", SHI, Wancong etc., Chemical Industry Press (1st edition), pp. 7-8, Sep. 31, 2002.

Asthana et al., "Materials Processing and Manufacturing Science," Materials Science in Manufacturing, 1st edition, Elsevier pp. 348-350 (2006).

Ruby et al., "Self-aligned selective-emitter plasma-etchback and passivation process for screen-printed silicon solar cells," Solar Energy Materials and Solar Cells 48: 255-260 (1997).

* cited by examiner

PASTE FOR PREPARING MASK PATTERNS AND MANUFACTURING METHOD OF SOLAR CELL USING THE SAME

This application is a National Stage Entry of International Application No. PCT/KR2010/006970, filed Oct. 12, 2010, and claims the benefit of Korean Application No. 10-2009-0097297, filed on Oct. 13, 2009, which is hereby incorporated by reference for all purposes as if fully set forth herein.

BACKGROUND OF THE INVENTION

Field of the Invention

The present invention relates to a paste for preparing mask patterns and a manufacturing method of a solar cell using the same, and more particularly, to a paste for forming an etching mask pattern which may enable stable formation of a selective emitter layer using screen printing, and a manufacturing method of a silicon solar cell using the same.

Description of the Related Art

Recently, it is expected that conventional energy resources such as oil or charcoal will be exhausted, and thus, interests in alternative energy are increasing. Among alternative energy, particularly a solar cell has abundant energy resources and does not cause environmental pollution, and thus, it becomes the object of attention.

The solar cell is classified into a solar heat cell that produces vapor required to run a turbine using solar heat, and a solar light cell that converts photons into electrical energy using properties of a semiconductor. Generally, the solar light cell (hereinafter referred to as a solar cell) represents a solar cell.

The solar cell largely includes a silicon solar cell, a compound semiconductor solar cell, and a tandem solar cell according to raw material. Among them, the silicon solar cell leads the solar cell market.

Figure 1:
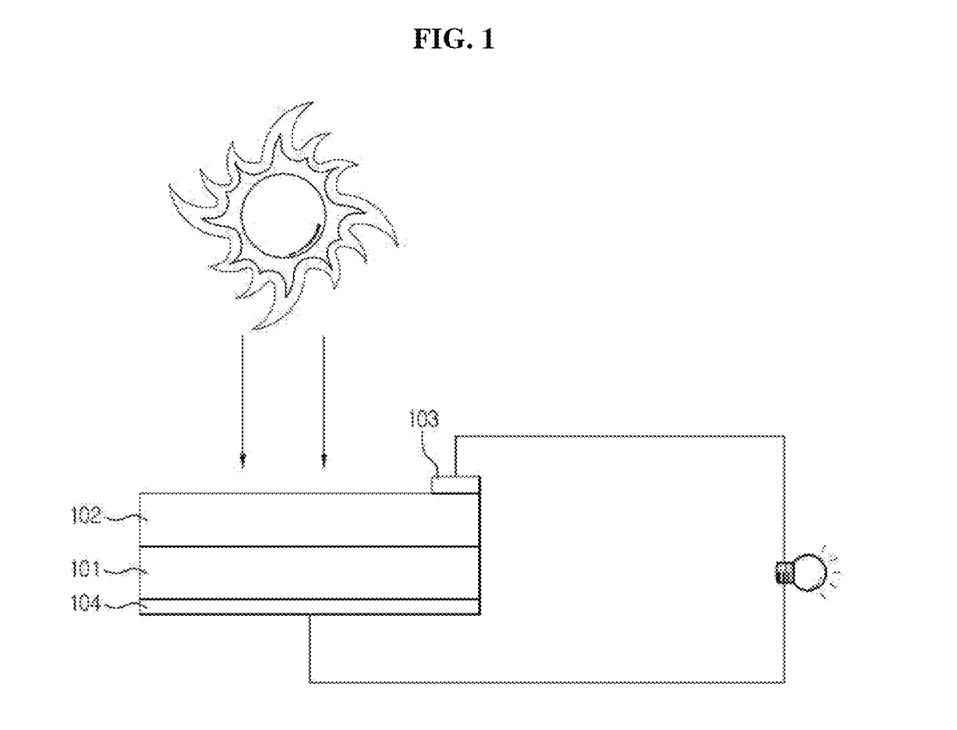
FIG. 1 is a schematic cross-sectional view illustrating a structure of a conventional silicon solar cell.

FIG. 1 is a cross-sectional view illustrating a basic structure of a silicon solar cell. Referring to FIG. 1, the silicon solar cell includes a substrate 101 of a p-type silicon semiconductor, and an emitter layer 102 of an n-type silicon semiconductor. A p-n junction is formed at an interface between the substrate 101 and the emitter layer 102 in a similar way to a diode.

When light falls on a solar cell having the above-mentioned structure, electrons and electron holes are created in a silicon semiconductor doped with an impurity by the photovoltaic effect. Specifically, electrons are created in the emitter layer 102 of an n-type silicon semiconductor as majority carriers, and electron holes are created in the substrate 101 of a p-type silicon semiconductor as majority carriers. The electrons and electron holes created by the photovoltaic effect are drawn toward the n-type silicon semiconductor and the p-type silicon semiconductor, and move to a front electrode 103 on the emitter layer 102 and a rear electrode 104 below the substrate 101, respectively. When the front electrode 103 and the rear electrode 104 are connected to each other with an electrical wire, an electrical current flows.

The output characteristics of the solar cell are evaluated using an output current-voltage curve of the solar cell. On the output current-voltage curve, a point where a value Ip×Vp obtained by multiplying an output current Ip by an output voltage Vp is at a maximum, is defined as a maximum output Pm, and a value obtained by dividing the maximum output Pm by the total light energy incident on the solar cell (S×I: S is the device area, I is the intensity of light irradiated on a solar cell) is defined as a conversion efficiency $\eta$. To improve the conversion efficiency $\eta$, it needs to increase a short-circuit current Isc (an output current when V=0 on the output current-voltage curve) or an open-circuit voltage Voc (an output voltage when I=0 on the output current-voltage curve) or to increase a fill factor that measures the squareness of the output current-voltage curve. As the fill factor approaches 1, the output current-voltage curve gets close to an ideal squareness and the conversion efficiency $\eta$ increases.

Among the above-mentioned three factors for determining the conversion efficiency of the solar cell, an open-circuit voltage behavior is closely related with a doping concentration of an n-type impurity when an emitter layer is formed by diffusing the n-type impurity into the surface of a substrate of a p-type silicon semiconductor. For reference, a doping profile of the n-type impurity shows that a doping concentration is highest at the surface of an emitter layer and decreases toward the inside of the emitter layer according to a Gaussian distribution or an Error function.

Conventionally, there is a tendency to excessively dope an emitter layer with an impurity to increase an open-circuit voltage of a solar cell. In this case, an uppermost portion (hereinafter referred to as a dead layer) of the emitter layer has a higher doping concentration of an n-type impurity than the solubility of a solid in a silicon semiconductor. For reference, the dead layer has a thickness between about 50 to about 200 nm. As a result, mobility of carriers decreases near the surface of the emitter layer, a recombination rate of the carriers increases by influence of excessive scattering of impurities, and life of the carriers reduces.

To solve the problems, an emitter etch-back process has been suggested. The emitter etch-back process is performed in such a way that a dead layer affecting adversely the performance of a solar cell is removed by wet etching using a mixture of nitric acid and hydrofluoric acid or $CF_4$ plasma etching after an emitter layer is formed through a diffusion process under the conditions of excessive doping with an impurity.

However, the mixture of nitric acid and hydrofluoric acid or $CF_4$ plasma has disadvantages of poor etching selectivity and a high etching rate for an area doped excessively with an n-type impurity. Thus, the conventional emitter etch-back process has low process reproducibility and low stability in selectively removing only an area doped excessively with an n-type impurity, that is, the surface of the emitter layer.

Under this situation, to ensure process reproducibility and stability of the emitter etch-back process, conventionally overetching occurred, that is, even a portion of an area doped suitably with an n-type impurity was etched, as well as on an area doped excessively with an n-type impurity. When an emitter layer is overetched, there is a deterioration in contact characteristics of a front electrode connected with the emitter layer due to a low impurity concentration of the surface of the emitter layer. As a result, contact resistance between the front electrode and the emitter layer increases, and accordingly, the fill factor of a solar cell decreases. And, the decrease in fill factor causes reduction in conversion efficiency of the solar cell.

Meanwhile, a selective emitter process has been introduced to overcome the drawbacks of the emitter etch-back process. The selective emitter process is performed after the emitter etch-back process, and the selective emitter process comprises forming a mask pattern exposing only an area where a front electrode is to be formed, and further diffusing an n-type impurity into the surface of the emitter layer exposed through the mask pattern, so that an emitter layer doped with a high concentration of n-type impurity is formed only at an area where a front electrode is to be formed. However, the selective emitter process needs photolithography and an additional impurity diffusion process to form a mask pattern, and as a result, it has drawbacks of complicated manufacturing process and increased manufacturing costs of a solar cell.

SUMMARY OF THE INVENTION

Therefore, it is an object of the present invention to provide a method for manufacturing a silicon solar cell using screen printing, which may ensure reliability and simplicity of a process for forming a selective emitter layer so as to improve the efficiency of a silicon solar cell, and may reduce manufacturing costs of the solar cell.

To achieve the object, a paste composition for preparing mask patterns according to the present invention may be used to form a selective emitter layer of a silicon solar cell, and may include inorganic powder, an organic solvent, a binder resin, and a plasticizer.

In the paste of the present invention, the plasticizer may include, for example, phthalic acid ester, benzoic acid ester, phosphoric acid ester, trimellitic acid ester, polyester, citric acid ester, adipic acid ester, epoxy compound, or mixtures thereof, however the plasticizer is not limited in this regard. The plasticizer may be any solvent capable of providing plasticity.

Also, to achieve the object, a manufacturing method of a silicon solar cell according to the present invention may include (a) preparing a silicon semiconductor substrate doped with a first conductive impurity; (b) forming an emitter layer on the substrate by doping an upper portion of the substrate with a second conductive impurity having the opposite polarity to the first conductive impurity; (c) forming an etching mask pattern by screen-printing a paste containing inorganic powder, an organic solvent, a binder resin, and a plasticizer at a front electrode connection area on the emitter layer; (d) etching back the emitter layer by using the etching mask pattern as a mask; (e) removing the etching mask pattern remaining after the etch-back; (f) forming an anti-reflection film over a front surface of the substrate; (g) establishing a connection between a front electrode and the front electrode connection area through the anti-reflection film; and (h) establishing a connection between a rear electrode and a rear surface of the substrate.

In the manufacturing method, the first conductive impurity is a p-type impurity and the second conductive impurity is an n-type impurity.

Preferably, in the step (d), the emitter layer may be etched back using a selective wet etchant in which $HNO_3$, HF, $CH_3COOH$ and $H_2O$ is mixed at a volume ratio of 10:0.1~0.01:1~3:5~10. In this instance, the selective wet etchant may have an etch rate of 0.08 to 0.12 µm/sec for a high density impurity area in the emitter layer, and may have an etching rate of 0.01 to 0.03 µm/sec for a low density impurity area in the emitter layer.

Alternatively, in the step (d), the emitter layer may be etched back using an alkaline wet etchant such as KOH or using a dry etchant such as $CF_4$ plasma.

Effects of the Invention

According to the present invention, a mask pattern formed from a paste composition of the present invention through an etch-back process is not easily detached, thereby stably forming an emitter. Further, the use of a selective wet etchant in an emitter etch-back process may ensure stability and reproducibility of the etch-back process.

Also, because high-temperature impurity doping is performed just once, as opposed to a conventional selective emitter layer forming process, it may prevent activation of an impurity in a substrate.

Also, because screen printing is used to form an etching mask pattern, it may lead to simpler manufacturing process and lower manufacturing costs than photolithography.

Also, because a mask pattern is simply formed by screen-printing a paste composition, it may eliminate the need for vacuum deposition equipment or a high temperature furnace.

BRIEF DESCRIPTION OF THE DRAWINGS

Other objects and aspects of the present invention will become apparent from the following description of embodiments with reference to the accompanying drawing in which.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

As described above, a selective emitter process needs formation of an etching mask pattern exposing only at an area where a front electrode is to be formed. Conventionally, the etching mask pattern was formed through photolithography, however the present invention provides a paste composition for forming an etching mask pattern using screen printing that allows simpler process and higher economic efficiency than photolithography.

The paste composition for forming an etching mask pattern according to the present invention may include inorganic powder, an organic solvent and a binder resin, and may further include a plasticizer.

Conventional paste compositions for forming an etching mask pattern frequently experienced edge curling during a drying process following a printed pattern forming process.

This occurs in a multi-wafer more prominently. Edge curling is believed to be due to a difference in thermal expansion between a substrate and a printed pattern during a drying process. During an etching process, an etchant may permeate a portion where edge curling occurred, causing detachment of a printed pattern.

However, the paste composition of the present invention contains a plasticizer that contributes to improvement in adhesion with a substrate and reduction in a difference in thermal expansion with the substrate, thereby preventing edge curling. Accordingly, an etching mask pattern formed using the paste composition of the present invention may have high resistance against an etchant in an etching process, and as a result, may enable stable formation of an emitter.

The plasticizer according to the present invention may include, for example, phthalic acid ester, benzoic acid ester, phosphoric acid ester, trimellitic acid ester, polyester, citric acid ester, adipic acid ester, epoxy compound, or mixtures thereof, however the plasticizer is not limited in this regard. The plasticizer may be any solvent capable of providing plasticity.

The content of the plasticizer may be 0.01 to 30 parts by weight per 100 parts by weight of the paste composition, preferably 0.1 to 30 parts by weight, more preferably 1 to 20 parts by weight.

When the content of the plasticizer is less than 0.01 parts by weight, a paste hardly has leveling properties and has low wettability with a substrate. When the content of the plasticizer exceeds 30 parts by weight, a pattern width increases, the content of a binder relatively decreases, rolling properties of a paste reduce when the paste is printed, and it is not easy to remove a mask pattern in a cleaning process following an etching process.

The inorganic powder included in the paste composition for forming an etching mask pattern according to the present invention may include, but are not limited to, glass frit powder selected from $SiO_2$—PbO based powder, $SiO_2$—PbO—$B_2O_3$ based powder, $Bi_2O_3$—$B_2O_3$—$SiO_2$ based powder, and PbO—$Bi_2O_3$—$B_2O_3$—$SiO_2$ based powder; metal oxide powder selected from $SiO_2$, $TiO_2$, $P_2O_5$, BaO, ZnO, ITO, and $Al_2O_3$; or mixtures thereof.

An average particle size of the inorganic powder according to the present invention may be, for example, between 1 nm to 10 μm, preferably between 1 nm to 3 μm. However, as the average particle size is smaller, a detachment start time of a printed pattern may be deferred. Accordingly, the average particle size of the inorganic powder is not limited to the exemplary range.

The content of the inorganic powder may vary depending on an apparent density to obtain effects intended by the present invention. For example, the content of the inorganic powder may be 0.1 to 80 weight % per the total weight of the paste composition.

The binder resin may include ethyl cellulose, acrylate-based resin, epoxy resin, urethane resin, polystyrene, polypropylene, and the like. Preferably, the binder resin has a molecular weight (Mw) of 5,000 to 1,000,000.

In the paste composition of the present invention, the organic solvent uniformly dissolves and/or disperses each component of the paste. The organic solvent may be an alcohol-based solvent such as terpineol, butyl carbitol or butyl carbitol acetate, texanol and so on, or mixtures thereof, however the present invention is not limited in this regard.

In the present invention, the content of a binder (including the binder resin and the organic solvent) may be 20 to 99.9 weight % based on the total weight of the paste, depending on the content of the inorganic powder. Here, the content of the binder resin may be properly selected according to various conditions. For example, the content of the binder resin may be 5 to 50 weight % based on the total weight of the binder, however the present invention is not limited in this regard. If the content of the binder resin is less than 5 weight %, the paste may have an excessively low viscosity and excessively high flowability. If the content of the binder resin exceeds 50 weight %, the resin may be not completely dissolved in the solvent depending on the molecular weight of the resin, or although the rein is dissolved in the solvent, the paste may exhibit low flowability due to intrinsic high viscosity of a paste.

Optionally, in the paste of the present invention, metal or metal oxide particles may be coated with an organic silane compound having a hydrophobic group, silicone oil or fatty acid, or an organic compound similar thereto so as to prolong the detachment start time of the mask pattern.

Optionally, in particle generation, a dispersant may be added to maintain dispersion stability of the inorganic powder, for example, fatty acid-based, benzotriazole-based, hydroquinone-based, and the like. Various kinds of dispersants may be used in consideration of stability with the binder used.

And, it is obvious that the paste composition of the present invention may further comprise an additive used typically in the art, for example, a wetting agent, a thixotropic agent, a thickening agent, an antifoaming agent, a leveling agent, and the like.

Hereinafter, an example of a manufacturing method of a silicon solar cell using the paste composition for forming an etching mask pattern according to the present invention is described with reference to FIGS. 2 to 7. FIGS. 2 to 7 are cross-sectional views illustrating a manufacturing method of a silicon solar cell using screen printing according to a preferred embodiment of the present invention.

Figure 2:
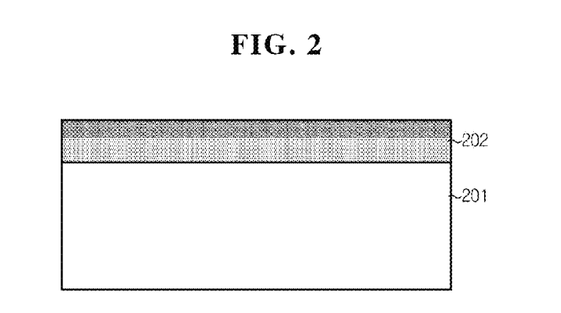
FIGS. 2 to 7 are cross-sectional views illustrating a method for manufacturing a silicon solar cell using screen printing according to a preferred embodiment of the present invention.

Referring to FIG. 2, firstly, a substrate 201 is prepared and loaded into a diffusion furnace. Here, the substrate 201 is made from a silicon semiconductor and doped with a first conductive impurity. The substrate 201 is a monocrystal, polycrystal or amorphous silicon semiconductor, and doped with a p-type impurity of group 3 elements in the periodic table, such as B, Ga, In, and the like. Next, an n-type impurity source of group 5 elements in the periodic table, such as P, As, Sb, and the like, is injected into the diffusion furnace together with an oxygen gas, and a thermal oxidation reaction occurs, so that an oxidation film containing an n-type impurity is formed on a front surface of the substrate 201 at a predetermined thickness. Then, the n-type impurity contained in the oxidation film is driven in an upper portion of the substrate 201 by increasing the temperature of the diffusion furnace up to 800 to 900° C. At this time, a diffusion time is 30 to 60 minutes to diffuse a sufficient amount of the n-type impurity into the substrate 201. When the n-type impurity contained in the oxidation film is diffused into the substrate 201 through the surface of the substrate 201, an emitter layer 202 of an n-type silicon semiconductor is formed at an upper portion of the substrate 201 with a predetermined thickness.

With the above-mentioned n-type impurity diffusion process, the concentration of the n-type impurity implanted into the emitter layer 202 is highest at the surface of the emitter layer 202 and decreases toward the inside of the substrate 201 according to a Gaussian distribution or an Error function. And, because the process conditions are controlled to diffuse a sufficient amount of n-type impurity during the diffusion process, and accordingly, a dead layer doped with an n-type impurity at higher concentration than solubility of a solid exists at an uppermost portion of the emitter layer 202.

Figure 8:
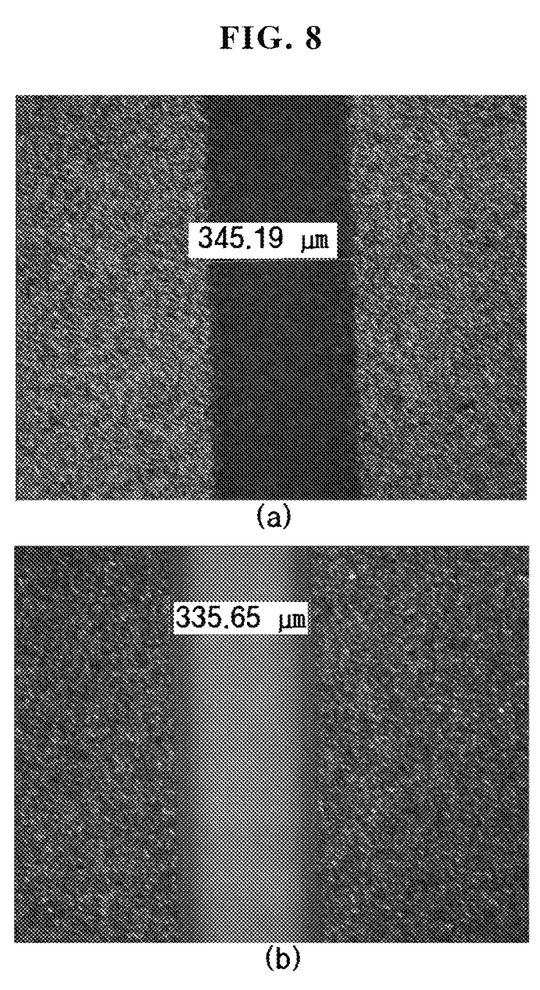
FIG. 8 is an optical microscopy image illustrating a printed pattern formed from a paste composition of example 1 before etching (a) and after etching (b).

FIG. 8 is a graph illustrating a change in concentration of an n-type impurity from the surface of the emitter layer 202 toward the substrate 201 after diffusion of the n-type impurity is completed. In the graph, a horizontal axis is the depth of a point where the concentration of an n-type impurity is measured, relative to the surface of the emitter layer 202, and a vertical axis is the concentration of an n-type impurity at a measurement point.

Referring to FIG. 8, the concentration of an n-type impurity is highest near the surface of the emitter layer 202 and decreases inward the substrate 201. In particular, a dead layer doped with an n-type impurity at a higher concentration than solubility of a solid in a silicon semiconductor exists near the surface of the emitter layer 202 (as indicated as a dotted box). The concentration of the n-type impurity contained in the dead layer depends on the kind of the n-type impurity. For example, when the n-type impurity is phosphorus (P), the concentration of the n-type impurity is $10^{20}$ atom/cm$^3$ or above.

Meanwhile, the emitter layer forming process disclosed in the embodiment of the present invention is just a preferable example for the purpose of illustrations only, not intended to limit the scope of the invention, so it should be understood that other equivalents and modifications could be made thereto without departing from the spirit and scope of the invention.

Figure 3:
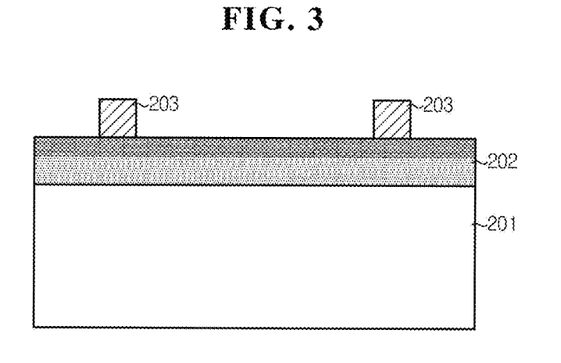

After the emitter layer 202 is formed as described above, an etching mask pattern 203 is formed using screen printing at a front electrode (205 of FIG. 7) connection area on the emitter layer 202 doped with an n-type impurity, as shown in FIG. 3. Specifically, a mask (not shown) for printing is placed on the emitter layer 202. Here, the mask for printing has an opening pattern at a corresponding portion to an area where the etching mask pattern 203 will be formed. Next, the opening pattern is filled up by squeezing a paste for forming the etching mask pattern into the opening pattern while moving a screen printer (not shown) in a predetermined direction. Then, the mask for printing is removed from the emitter layer 202 to form the etching mask pattern 203 on the emitter layer 202. However, screen printing for forming the etching mask pattern 203 is not limited to the above-mentioned specific process.

Figure 4:
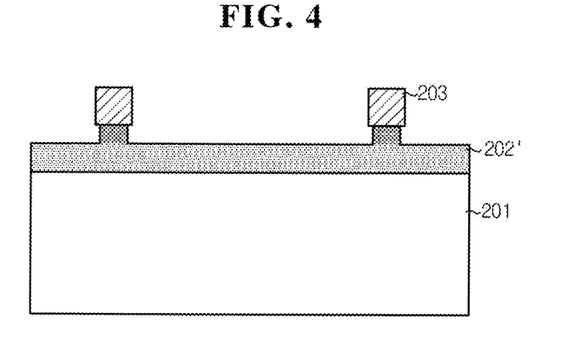

After the etching mask pattern 203 is formed, a selective emitter layer 202' is formed by etching back the emitter layer 202 using the etching mask pattern 203 on the emitter layer 202 as a mask, as shown in FIG. 4. In the etch-back process of the emitter layer 202, only an upper portion of the emitter layer 202, that is not covered with the etching mask pattern 203, is etched at a predetermined depth. Thus, in the emitter layer 202 doped with a high concentration of impurity, only an area on which a solar light is incident can be selectively removed. The selective emitter layer 202' is doped with a high concentration of n-type impurity only at an area where a front electrode 205 is connected. As a result, the front electrode 205 can have improved contact characteristics, thereby forming an ohmic contact. Also, because an area doped excessively with an n-type impurity in the emitter layer is removed, the life of carriers reduces, thereby preventing reduction in efficiency of a solar cell.

In the etch-back process of the emitter layer 202, both a wet etchant and a dry etchant may be used. It is preferable to use a selective wet etchant so as to ensure stability and reproducibility of the etch-back process. For example, in the present invention, the emitter layer 202 is etched back using a selective wet etchant in which $HNO_3$, HF, $CH_3COOH$ and $H_2O$ are mixed at a volume ratio of 10:0.1~0.01:1~3:5~10. As the concentration of an impurity implanted into the emitter layer 202 is higher, the selective wet etchant has a faster etch rate. That is, the selective wet etchant has an etch rate of 0.08 to 0.12 μm/sec for an area doped with an impurity in a high concentration, and an etch rate of 0.01 to 0.03 μm/sec for an area doped with an impurity in a low concentration. Accordingly, when an etch-back process is performed using the selective wet etchant, an uppermost portion of the emitter layer 202 doped with an n-type impurity in a high concentration is selectively removed at the initial stage of the etching process, thereby ensuring stability and reproducibility of the etch-back process. Meanwhile, it is obvious that an etch rate of the selective wet etchant may vary depending on a volume ratio of an etch solution composition, kind and concentration of the diffused impurity, and the like. Alternatively, an alkaline wet etchant such as KOH or a dry etchant such as $CF_4$ plasma may be used in the etch-back process of the emitter layer 202, which is obvious to an ordinary person skilled in the art.

Figure 5:
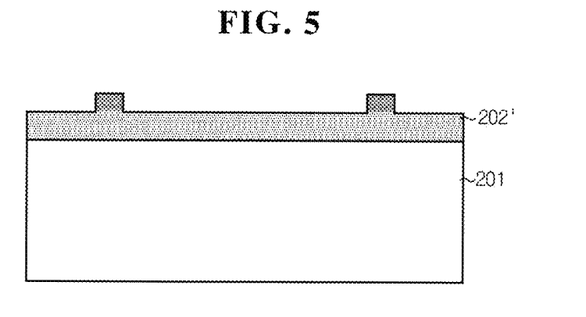
Figure 6:
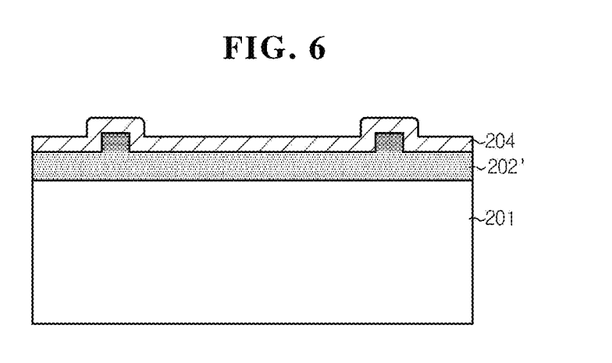

After the etch-back process of the emitter layer 202 finishes, the selective emitter layer 202' is completely formed by removing the etching mask pattern 203 remaining on the substrate 201, as shown in FIG. 5. Then, an anti-reflection film 204 is formed on the selective emitter layer 202', as shown in FIG. 6. The anti-reflection film 204 may have a single film structure of any one selected from the group consisting of a silicon nitride film, a silicon nitride film containing hydrogen, a silicon oxide film, a silicon oxynitride film, $MgF_2$, ZnS, $MgF_2$, $TiO_2$ and $CeO_2$, or a multiple film structure of at least two material films. The anti-reflection film 204 is formed by vacuum deposition, chemical vapor deposition, spin coating, screen printing or spray coating. However, the present invention is not limited to specific structure and forming method of the anti-reflection film 204.

Figure 7:
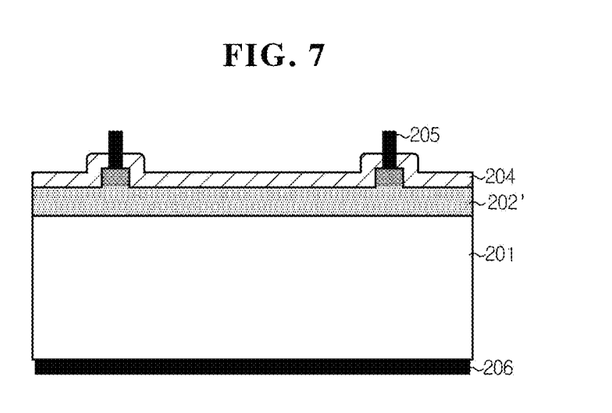

After the anti-reflection film 204 is formed, a front electrode 205 and a rear electrode 206 are connected with the upper surface of the selective emitter layer 202' and the rear surface of the substrate 201, respectively, as shown in FIG. 7. The front electrode 205 and the rear electrode 206 may be formed by various well-known techniques, however screen printing is preferred. That is, the front electrode 205 is formed by screen-printing a paste for forming a front electrode, containing silver (Ag), glass frit, and a binder at an area where the front electrode is to be formed, followed by thermal treatment. During the thermal treatment, the front electrode 205 penetrates through the anti-reflection film 204 due to a punch-through phenomenon, and is connected with the selective emitter layer 202'.

Similarly, the rear electrode 206 is formed by printing, on the rear surface of the substrate 201, a paste for forming a rear electrode, containing aluminum, quartz silica, and a binder, followed by thermal treatment. In the thermal treatment of the rear electrode, aluminum, that is, one of the components of the rear electrode, diffuses through the rear surface of the substrate 201, and a back surface field (not shown) layer may be formed at an interface between the rear electrode 206 and the substrate 201. The back surface field layer prevents carriers from moving to the rear surface of the substrate 201 and recombinating. Prevention of recombination of carriers contributes to increase in open-circuit voltage and fill factor, thereby improving conversion efficiency of a solar cell.

The present invention is not limited to a specific process for manufacturing the front electrode 205 and the rear electrode 206. For example, the front electrode 205 and the rear electrode 206 may be manufactured by typical photolithography and metal deposition other than screen printing.

Hereinafter, the present invention will be described in detail through specific examples. However, the description proposed herein is just a preferable example for the purpose of illustrations only, not intended to limit the scope of the invention, so it should be understood that the examples are provided for a more definite explanation to an ordinary person skilled in the art.

Examples 1 to 3 and Comparative Examples 1 and 2

Each paste composition for forming an etching mask pattern was prepared according to composition shown in the following table 1. A plasticizer was dipropylene glycol benzoate (DPD), and a binder was obtained by adding ethyl cellulose (EC) to a solvent of butyl carbitol (BC) and terpineol (T) at a mixing ratio of 4:1, and heating and mixing them.

TABLE 1

| Inorganic powder | | | Binder (weight %) Resin (weight % in binder) | Plasticizer (weight %) |
|---|---|---|---|---|
| Type (weight %) | | Average particle size (μm) | | |
| Example 1 | $SiO_2$(30) | 3 | EC + BC + T(67) 15 | DPD(3) |
| Example 2 | $SiO_2$(30) | 3 | EC + BC + T(64) 15 | DPD(6) |
| Example 3 | $SiO_2$(30) | 3 | EC + BC + T(61) 15 | DPD(9) |
| Comparative example 1 | $SiO_2$(30) | 3 | EC + BC + T(70) 15 | — |

Test Example: Evaluation of Printed Pattern

Figure 9:
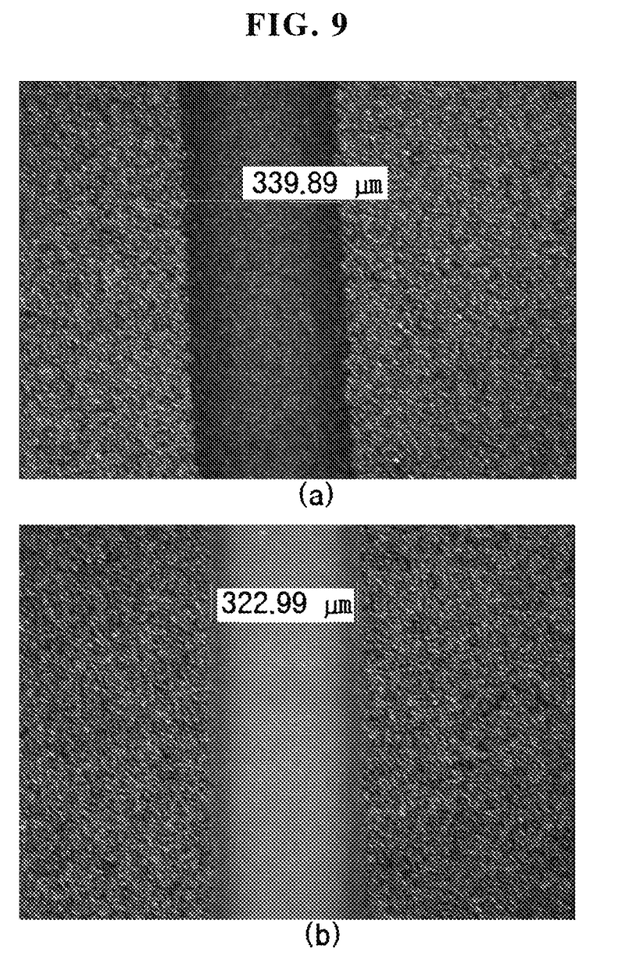
FIG. 9 is an optical microscopy image illustrating a printed pattern formed from a paste composition of example 2 before etching (a) and after etching (b).
Figure 10:
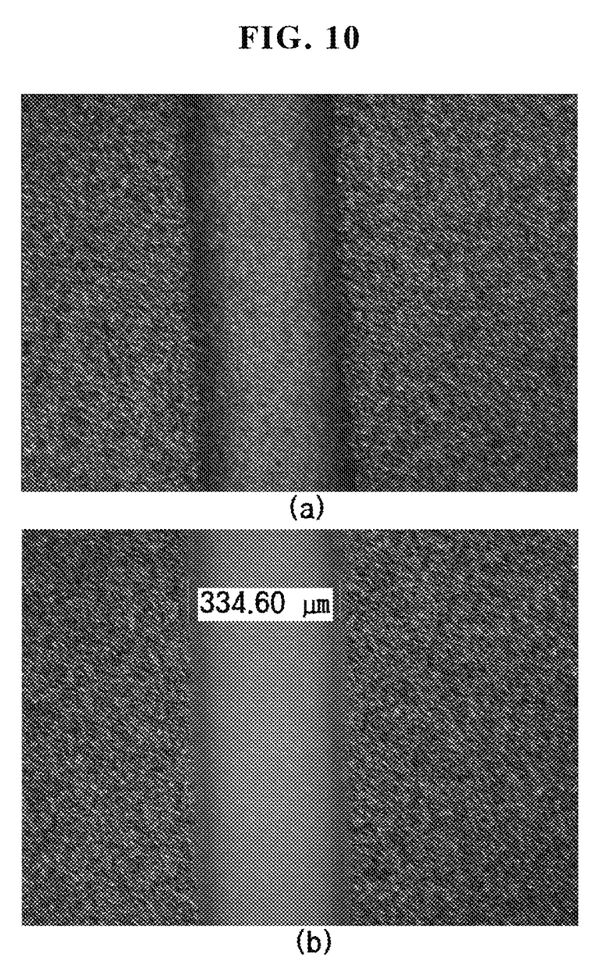
FIG. 10 is an optical microscopy image illustrating a printed pattern formed from a paste composition of example 3 before etching (a) and after etching (b).

The optical microscopy images of printed patterns formed from the paste compositions of examples 1 to 3 before etching (a) and after etching (b), are shown in FIG. 8 (Example 1), FIG. 9 (Example 2), and FIG. 10 (Example 3), respectively.

As seen in FIGS. 8 to 10, it is found that edge curling or detachment from a substrate does not occur in printed patterns formed from the paste compositions of examples after etching, and this is believed to be due to improvement in adhesion with a substrate caused by addition of a plasticizer.

Also, it is found that the examples have improvement in surface leveling and a uniform pattern height of printed patterns, and accordingly, the examples avoid ununiform etching of the patterns.

Figure 11:
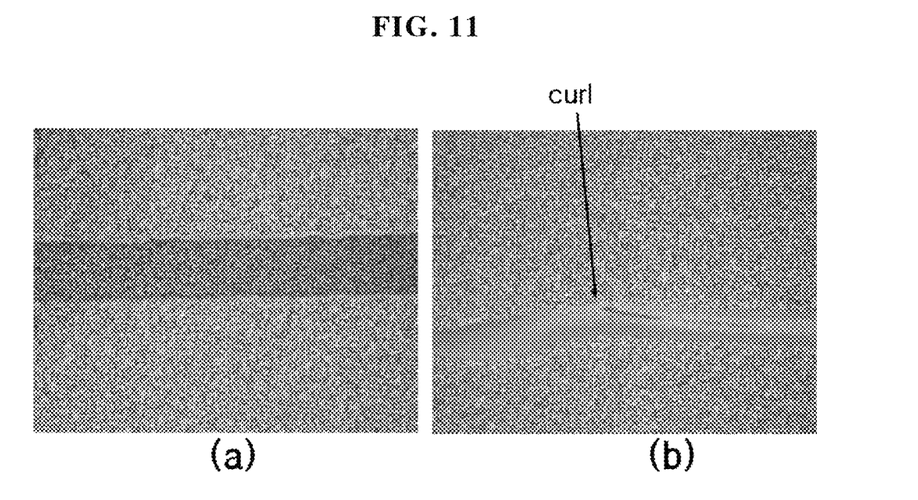
FIG. 11 is an optical microscopy image illustrating printed patterns formed from paste compositions of example 1(a) and comparative example 1(b) after etching.

Conversely, edge curling occurred in the printed pattern of the comparative example 1 after etching. The difference in printed patterns between example 1 and comparative example 1 is shown in FIG. 11 (Example 1(a) and Comparative example 1(b)).

What is claimed is:

1. A manufacturing method of a silicon solar cell, comprising:
   (a) preparing a silicon semiconductor substrate doped with a first conductive impurity;
   (b) forming an emitter layer on the substrate by doping an upper portion of the substrate with a second conductive impurity having the opposite polarity to the first conductive impurity;
   (c) forming an etching mask pattern by screen-printing a paste containing inorganic powder, an organic solvent, a binder resin, and a plasticizer at a front electrode connection area on the emitter layer;
   (d) etching back the emitter layer by using the etching mask pattern as a mask;
   (e) removing the etching mask pattern remaining after the etch-back;
   (f) forming an anti-reflection film over a front surface of the substrate;
   (g) establishing a connection between a front electrode and the front electrode connection area through the anti-reflection film; and
   (h) establishing a connection between a rear electrode and a rear surface of the substrate,
   wherein the inorganic powder comprises one or more metal oxide powder selected from the group consisting of $SiO_2$, $P_2O_5$, BaO, ZnO, ITO and $Al_2O_3$,
   and the metal oxide powder is coated with an organic compound, the organic compound is at least one selected from the group consisting of a silicone oil, a fatty acid and an organic silane compound having a hydrophobic group,
   and the plasticizer is any one selected from the group consisting of phthalic acid ester, benzoic acid ester, phosphoric acid ester, trimellitic acid ester, polyester, citric acid ester, adipic acid ester, and epoxy compound, or mixtures thereof and the plasticizer is present in an amount of from 0.01 to 30 parts by weight per 100 parts by weight of the paste composition.

2. The manufacturing method of a silicon solar cell according to claim 1,
   wherein the first conductive impurity is a p-type impurity and the second conductive impurity is an n-type impurity.

3. The manufacturing method of a silicon solar cell according to claim 1,
   wherein in the step (d), the emitter layer is etched back using a selective wet etchant in which $HNO_3$, HF, $CH_3COOH$ and $H_2O$ are mixed at a volume ratio of 10:0.1~0.01:1~3:5~10.

4. The manufacturing method of a silicon solar cell according to claim 3,
   wherein the selective wet etchant has an etch rate of 0.08 to 0.12 μm/sec for a high concentration impurity area in the emitter layer and an etch rate of 0.01 to 0.03 μm/sec for a low concentration impurity area in the emitter layer.

5. The manufacturing method of a silicon solar cell according to claim 1,
   wherein in the step (d), the emitter layer is etched back using an alkaline wet etchant or a plasma dry etchant.

* * * * *